(12) United States Patent
Cho et al.

(10) Patent No.: US 8,057,598 B2
(45) Date of Patent: Nov. 15, 2011

(54) MANUFACTURING EQUIPMENT FOR POLYSILICON INGOT

(76) Inventors: Young Sang Cho, Incheon (KR); Young Jo Kim, Incheon (KR)

( * ) Notice: Subject to any disclaimer, the term of this patent is extended or adjusted under 35 U.S.C. 154(b) by 1194 days.

(21) Appl. No.: 11/760,284

(22) Filed: Jun. 8, 2007

(65) Prior Publication Data

US 2007/0283882 A1 Dec. 13, 2007

(30) Foreign Application Priority Data

Jun. 13, 2006 (KR) .................. 10-2006-0053214
Mar. 21, 2007 (KR) .................. 10-2007-0027424

(51) Int. Cl.
*C30B 35/00* (2006.01)
(52) U.S. Cl. ........ 117/218; 117/200; 117/204; 117/206; 117/216; 117/217; 117/222
(58) Field of Classification Search .................. 117/200, 117/204, 206, 216, 217, 218, 222
See application file for complete search history.

(56) References Cited

U.S. PATENT DOCUMENTS

| | | | |
|---|---|---|---|
| 4,040,849 A | 8/1977 | Greskovich et al. | |
| 4,242,307 A | 12/1980 | Fally | |
| 4,247,528 A | 1/1981 | Dosaj et al. | |
| 6,019,842 A | 2/2000 | Yatsurugi | |
| 6,093,913 A | 7/2000 | Schrenker et al. | |
| 6,136,091 A * | 10/2000 | Yamazaki et al. | 117/81 |
| 6,238,483 B1 | 5/2001 | Cherko | |
| 6,285,011 B1 | 9/2001 | Cherko | |
| 6,309,461 B1 * | 10/2001 | Gianoulakis et al. | 117/206 |
| 6,309,467 B1 | 10/2001 | Wochner et al. | |
| 6,334,603 B1 | 1/2002 | Wakita et al. | |
| 6,383,285 B1 | 5/2002 | Wakita et al. | |
| 6,413,313 B1 | 7/2002 | Yoshida et al. | |
| 6,454,851 B1 | 9/2002 | Fuerhoff et al. | |
| 6,540,828 B2 | 4/2003 | Wakita et al. | |
| 6,679,759 B2 | 1/2004 | Kajimoto et al. | |
| 6,732,992 B2 | 5/2004 | Wakita et al. | |
| 6,869,863 B2 | 3/2005 | Nishida | |
| 2003/0097978 A1 * | 5/2003 | Glavish et al. | 117/200 |

FOREIGN PATENT DOCUMENTS

| | | |
|---|---|---|
| DE | 19855061 | 5/2000 |
| EP | 0748884 | 12/1996 |
| JP | 63-166711 | 7/1988 |
| JP | 63166711 A * | 7/1988 |
| JP | 07-138011 | 5/1995 |
| JP | 11-021120 | 1/1999 |

(Continued)

OTHER PUBLICATIONS

Patent Abstracts of Japan. English Abstract of JP 63-166711 (1988).*

*Primary Examiner* — Matthew Song
(74) *Attorney, Agent, or Firm* — Cantor Colburn LLP

(57) ABSTRACT

Disclosed therein is an apparatus for producing a polycrystalline silicon ingot for a solar cell, which has uniform crystal grains formed by solidifying silicon melted in a crucible using a cooling plate. The polycrystalline silicon ingot producing apparatus includes: a crucible for melting silicon; conveying shafts for adjusting the height of the crucible; heaters for heating the crucible; and a cooling plate located below the crucible for cooling the crucible.

9 Claims, 7 Drawing Sheets

FOREIGN PATENT DOCUMENTS

| | | |
|---|---|---|
| JP | 11-92284 | 4/1999 |
| JP | 11-116386 | 4/1999 |
| JP | 2001-19593 | 1/2001 |
| JP | 2002-145608 | 5/2002 |
| JP | 2003-165716 | 6/2003 |
| JP | 2005-132671 | 5/2005 |

* cited by examiner

MANUFACTURING EQUIPMENT FOR POLYSILICON INGOT

BACKGROUND OF THE INVENTION

1. Field of the Invention

The present invention relates to an apparatus for producing a silicon ingot, and more particularly, to an apparatus for producing a polycrystalline silicon ingot used for a solar cell.

2. Background Art

Recently, according to an increase of the demand of solar cells of several tens percents or so yearly, the demand of polycrystalline silicon ingots for the solar cells is also increased greatly every year. In general, the polycrystalline silicon ingot for the solar cell is produced through the steps of charging a raw silicon material into a quartz or graphite crucible and melting it, followed by directional solidification.

FIG. 1 is a sectional view of an apparatus for producing a polycrystalline semiconductor ingot according to the prior art.

Referring to FIG. 1, the apparatus for producing the polycrystalline semiconductor ingot disclosed in U.S. Pat. No. 6,136,091 will be described. The apparatus for producing the polycrystalline semiconductor ingot includes: a main body 140 having a chamber consisting of a hot zone therein; a quartz or graphite crucible 170 for containing a raw silicon material therein; supporting means (not shown) for supporting the quartz or graphite crucible 170; a sectional type rectangular heater 110 aligned around the crucible 170 to supply radiant heat energy for melting the raw silicon material; another crucible 170' for intercepting heat emitted around the quartz or graphite crucible 170; an insulating member 190 aligned around the sectional type rectangular heater 110; and a cooling jacket 160 having a cooling water inlet line 150 and a cooling water outlet line 180 for controlling temperature of the apparatus. So, a crucible protective layer is coated on the inner surface of the quartz or the graphite crucible, the raw silicon material is charged into the crucible, and then, the crucible and the completed sectional type rectangular heater are assembled to a casting device.

After the crucible and the sectional type rectangular heater are assembled to the inside of the casting device, vacuum is applied to the device to remove the air inside the device, and then, argon gas is supplied into the device of a vacuum state to change the internal pressure of the device into atmospheric pressure. The above process is repeatedly performed three times. After that, cooling water is supplied to cool the wall surface of the device, and continuously, power source is supplied to the sectional type rectangular heater to heat the inside temperature of the crucible up to more than 1,450° C. The above state is kept for more than two hours. When silicon charged into the crucible is completely melted, the power source supplied to the sectional type rectangular heater is controlled such that the crucible is cooled to the upper portion thereof from the lower portion thereof.

However, since the cooling of the crucible proceeding from the lower portion thereof to the upper portion thereof is not uniform only by the control of the power source supplied to the heater, it is difficult to achieve a uniform crystal growth, and ununiformity of a physical property of the ingot may be caused.

Japanese Patent Nos. 11,092,284 and 11,116,386 disclose an improved production of silicon ingot having a polycrystal structure coagulated in one direction. In Japanese Patent Nos. 11,092,284 and 11,116,386, for more improved temperature control, provided are a vertically movable crucible 170 and a conveying shaft located at the central portion of a pedestal.

However, such prior art arrangement exhibit a problem in that heat applied to the crucible 170 escapes to the outside through the conveying shaft to cause a loss of heat.

It follows that the efficiency of the prior art arrangements is poor.

DE-A-19855061 discloses a melting furnace that includes a heater fired beneath a crucible and a horizontally moveable cooking plate.

SUMMARY OF THE INVENTION

Accordingly, the present invention has been made to solve the above-mentioned problems occurring in the prior arts, and it is an object of the present invention to provide an apparatus for producing a polycrystalline silicon ingot for a solar cell, which includes heaters and insulating boards located facing all sides of a crucible, a plurality of the heaters and the insulating boards located beneath the crucible being opened horizontally, thereby forming uniform crystal grains through effective heating and cooling.

To accomplish the above object, according to the present invention, there is provided an apparatus for producing a polycrystalline silicon ingot including: a crucible for melting silicon; first conveying shafts disposed at edges of a pedestal mounted below the crucible for adjusting the height of the crucible; a plurality of first and second heaters that surround the crucible for heating the crucible, the second heaters being located beneath the crucible and being horizontally moveable to open an opening that exposes the crucible; a plurality of first and second insulating boards that surround the heaters, the insulating boards being located beneath the second heaters and being horizontally moveable together with the second heaters located beneath the crucible; and a cooling plate located below the second insulating boards for cooling the crucible.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
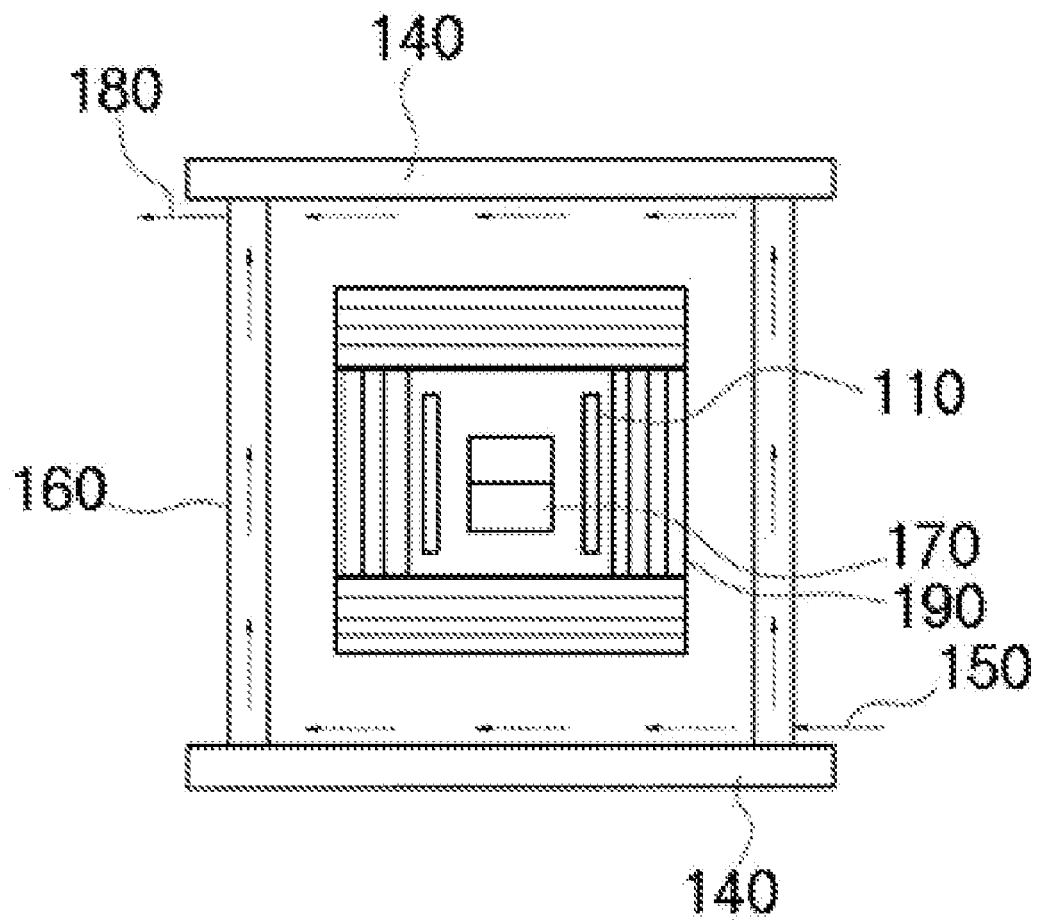
FIG. 1 is a sectional view of an apparatus for producing a polycrystalline semiconductor ingot according to the prior art.

Reference will be now made in detail to the preferred embodiment of the present invention with reference to the attached drawings. Terms or words used in this specification and claims should not be restrictively interpreted as ordinary meanings or dictionary-based meanings, but should be interpreted as meanings and concepts conforming to the scope of the present invention on the basis of the principle that an inventor can properly define the concept of a term to describe and explain his or her invention in the best ways.

Therefore, embodiments described herein and configurations illustrated in the drawings are merely the most preferred embodiments of the present invention, but not substitutes all of the variants of the present invention. So, it should be understood that various equivalents or modifications substituting for the embodiments could exist at a time point of the application of the present invention.

Figure 2:
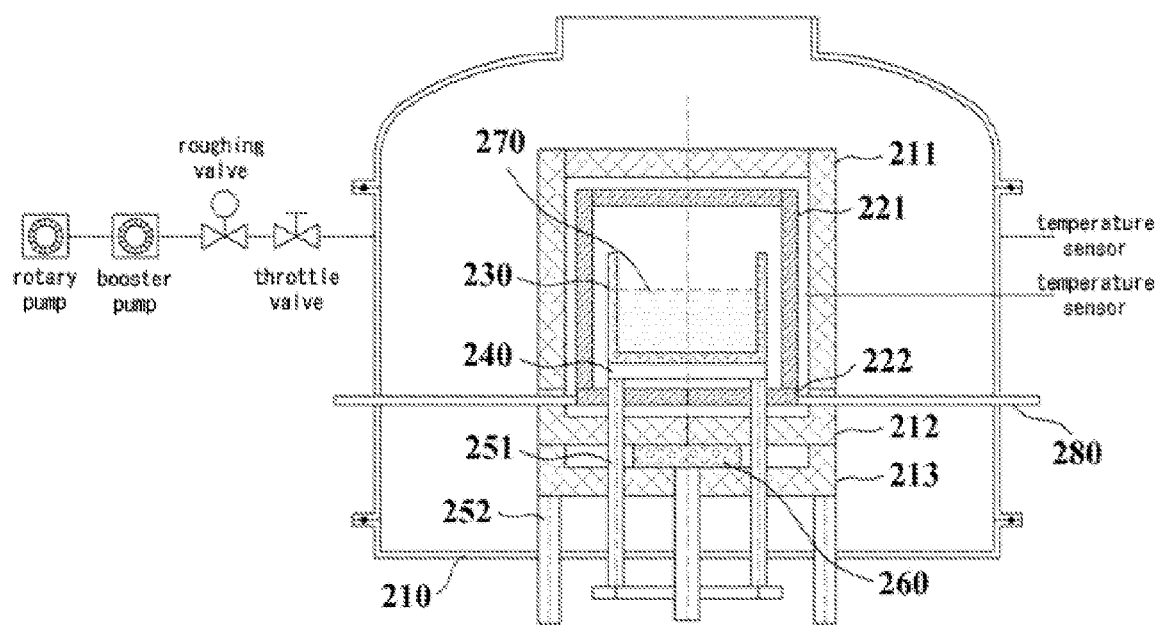
FIG. 2 is a sectional view of an apparatus for producing a polycrystalline silicon ingot according to the present invention.

FIG. 2 is vertical sectional view of an apparatus for producing a polycrystalline silicon ingot according to the present invention.

A crucible 230 is located inside an O-ring type chamber 210 for dissolving silicon. The chamber 210 has a tube formed inside the wall surface thereof, so that cooling water supplied from a cooling water line (not shown) flows therein. In addition, the chamber 210 has a temperature sensor for measuring temperature of the chamber.

According to the present invention, as a pump for forming a vacuum state inside the chamber 210, a booster pump and a rotary pump may be used. Moreover, a roughing valve and a throttle valve are used for keeping a proper degree of vacuum.

A pedestal 240 made of a carbon material is located below the crucible 230, and first and second heaters 221 and 222 are provided near to all sides of the crucible 230 for heating the crucible 230. Since the heaters 221 and 222 are connected with a power supply device (not shown) connected from the outside of the chamber, they emit heat by a supplied power source. The emitted heat is displayed on a controller through a plurality of temperature sensors provided adjacent the heaters. First conveying shafts 251 are located below the pedestal 240 for vertically conveying the crucible 230. The first conveying shafts 251 are mounted at four edges of the pedestal 240. In general, if the conveying shafts are located at the central portion of the pedestal 240, heat applied to the crucible 230 escapes to the outside through the conveying shafts and it causes a loss of heat, but if the conveying shafts are located at the edges of the pedestal 240, the loss of heat can be minimized. The second heaters 222 located below the crucible 230 are two heaters, which can be opened and closed, and so, the second heaters 222 are closed when the crucible 230 is heated but opened by moving toward the wall surface of the chamber, which is adjacent the second heaters, by a conveying jig 280 operated horizontally before the crucible 230 moves downwardly according to the operation of the first conveying shafts 251 to perform a cooling action after completion of the heating action.

Two insulating boards 212, which can be opened and closed by the conveying jig 280 operated horizontally in the same way as the second heaters 222, are mounted below the second heaters 222, and so may be opened by moving horizontally in the same way as the second heaters 222 before the crucible 230 moves downwardly by the first conveying shafts 251.

A cooling plate 260 is located below the second insulating boards 212 to cool the heated crucible 230. When the cooling plate 260 is used, it accelerates a cooling rate to maximize cooling efficiency. Finally, the cooling plate 260 can cause an optimization of a solidification process of melted silicon by properly adjusting the cooling speed.

The chamber according to the present invention can automatically control a degree of vacuum inside the chamber, temperature of the heaters, temperature of the chamber, a heating time period, and control of each component by a control board.

FIGS. 3 to 7 show a process for cooling the melted silicon.

First, a raw silicon material of high purity is charged into the crucible 230 disposed in the chamber 210, and then, the chamber 210 is sealed.

According to the embodiment of the present invention, besides the raw silicon material, electrical characteristics of polycrystalline silicon can be controlled by adding n-type or p-type impurities.

The inside of the sealed chamber 210 keeps the degree of vacuum ranging from $10^{-2}$ to $10^{-4}$ torr using the pump and the valve. Next, the first and second heaters 221 and 222 are operated to heat the crucible 230. When the crucible 230 is heated, the charged silicon is gradually melted. When melting is finished, the crucible 230 is cooled to solidify melted silicon 270.

Figure 3:
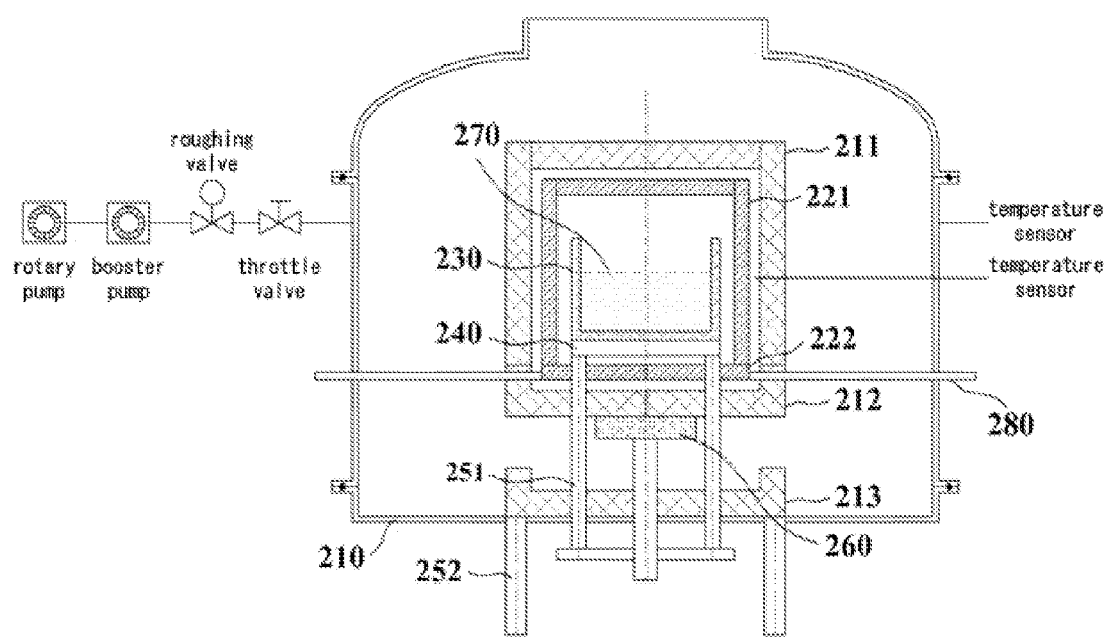
FIGS. 3 to 7 are views similar to FIG. 2 showing processes of the apparatus for producing the polycrystalline silicon ingot according to the present invention.

As shown in FIG. 3, temperature of the first heater 221 lowers and the second heaters 222 are disconnected from the electricity supply to solidify the melted silicon 270 using the cooling plate 260. Next, second conveying shafts 252 are operated to move a third insulating board 213 downwardly, and thereby, the second heaters 222 and the second insulating boards 212 are exposed to the outside. The melted silicon 270 starts to be partly solidified while heat of the crucible 230 is emitted to the exposed places.

Figure 4:
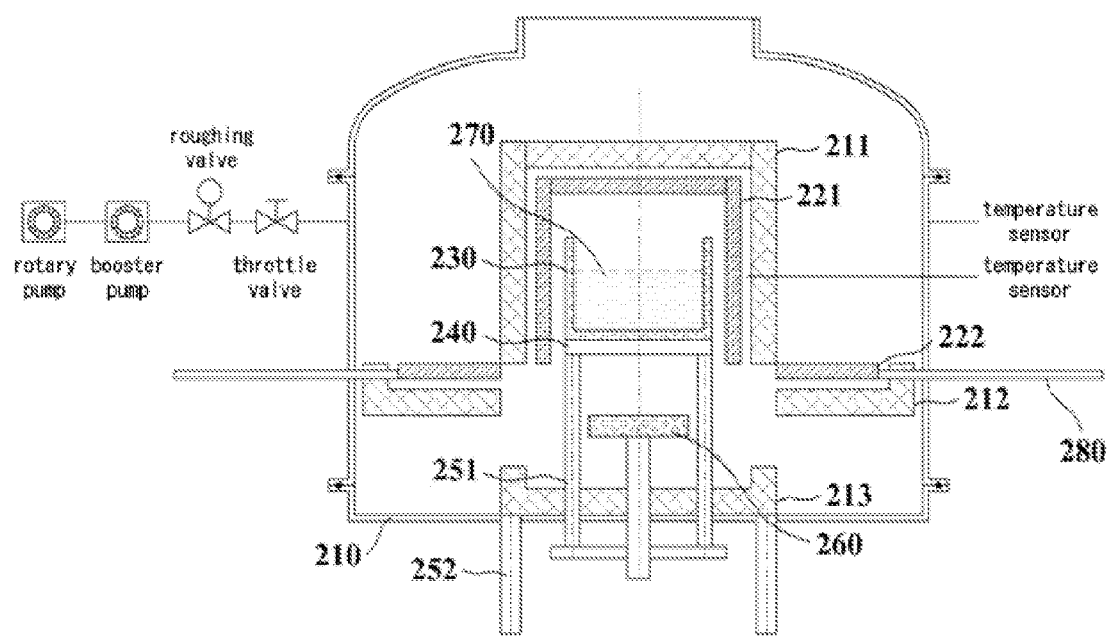

In this instance, as shown in FIG. 4, the conveying jig 280 moves toward a space formed between the first insulating board 211 and the second insulating board 212 to open the second heaters 222 and the second insulating boards 212 by moving them horizontally.

The insulating boards 211, 212 and 213 are formed in a multi-layer form so as to adjust the cooling speed of the crucible 230.

Figure 5:
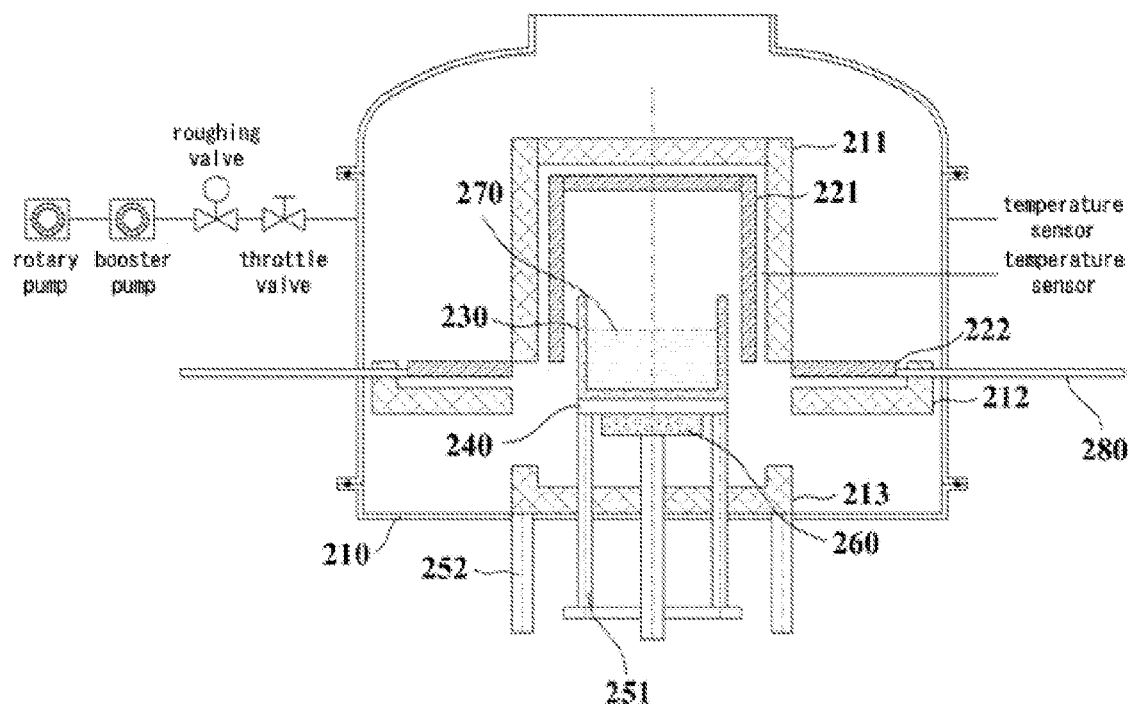
Figure 6:
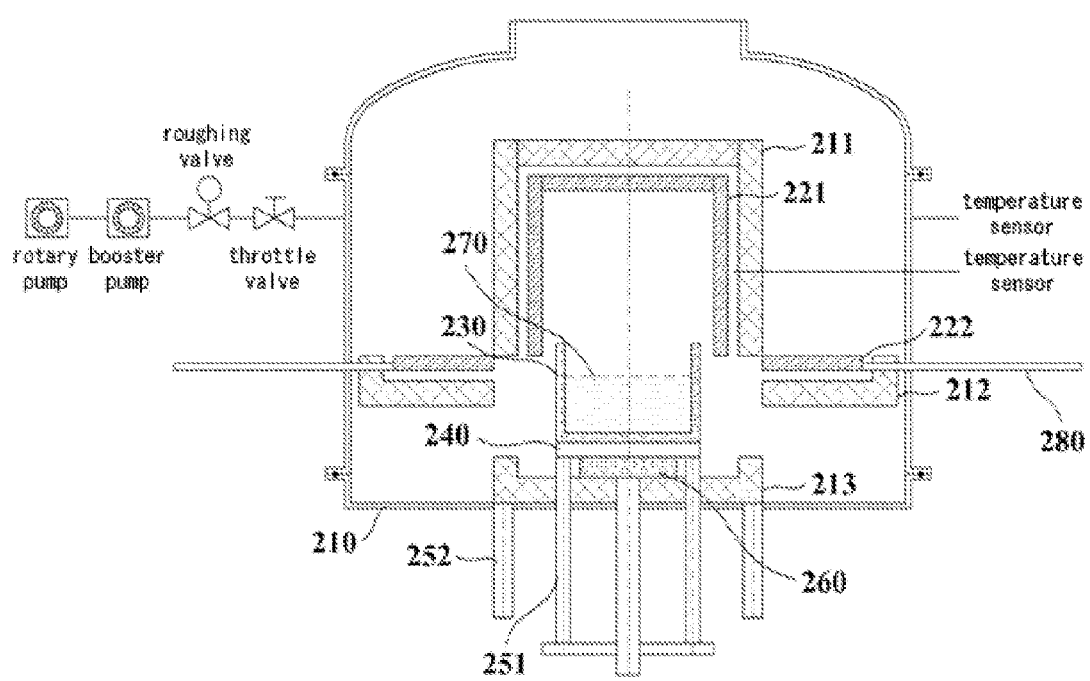

Next, as shown in FIG. 5, the cooling plate 260 is in contact with the pedestal 240 attached below the crucible 230, and then, the first conveying shafts 251 are moved.

The cooling plate 260 according to the present invention can adopt a water-cooled type such that fluid refrigerant, for example, cooling water, flows therein. When cooling below the crucible 230 is promoted by the cooling plate 260, the melted silicon 270 starts to be solidified below the crucible 230, which is in contact with the cooling plate 260, and the solidification advances in the upward direction. In this instance, the cooling speed is controlled by adjusting a vertical conveying speed of the conveying shafts 251 and 252, temperature of refrigerant flowing inside the cooling plate 260, temperature of the heaters, and so on. The crucible 230 lowers while being cooled by the cooling plate 260, so that maximization of cooling is achieved, and then the crucible 230 is in contact with the third insulating board 213. When the solidification of the melted silicon 270 is finished by the cooling plate 260, the crucible 230 is conveyed upwardly again, and the first and second heaters 221 and 222 are heated to perform an annealing process at temperature ranging from 900° C. to 1200° C.

The annealing process according to the present invention helps to minimize various defects inside the polycrystalline silicon occurable due to a heat stress generated while the melted silicon 270 is solidified and performs crystal growth.

Figure 7:
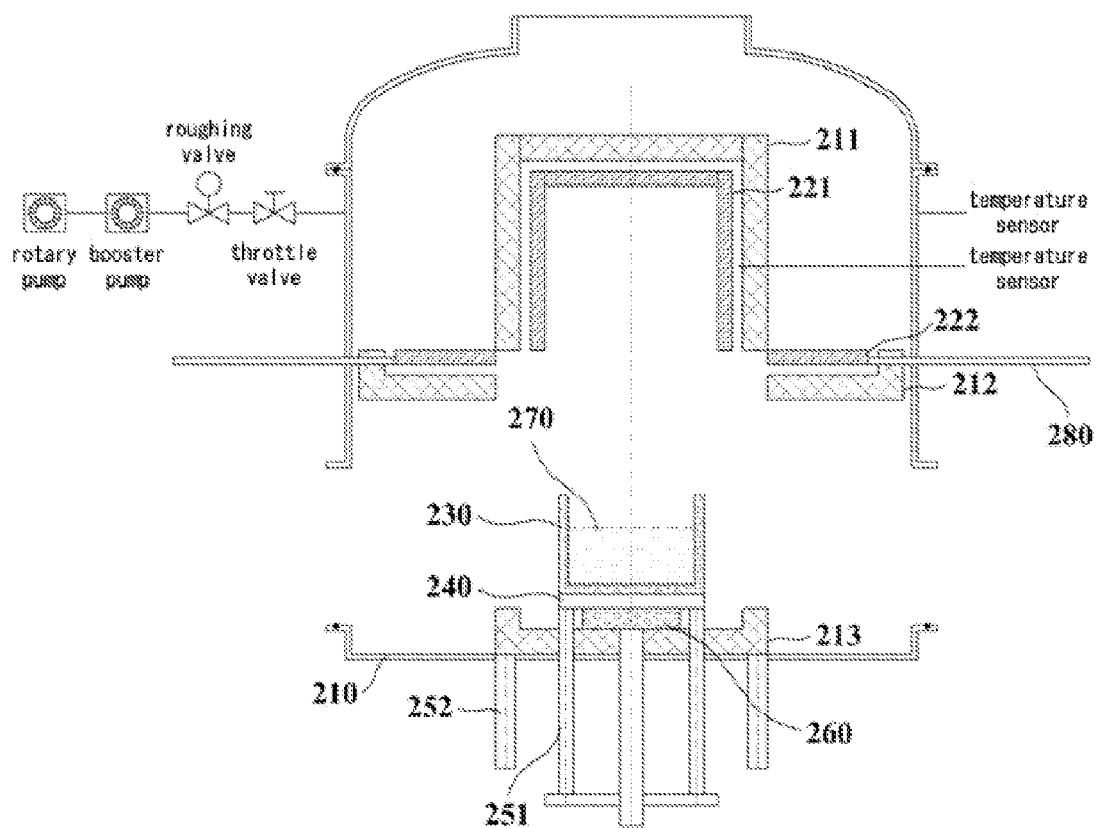

When the annealing process is finished, as shown in FIG. 7, purge gas is injected into the chamber 210, and when the inside pressure of the chamber 210 reaches atmospheric pressure, the chamber is opened and the solidified specimen is taken out.

According to the preferred embodiment of the present invention, if silicon seeds are used to form the polycrystalline silicon ingot, in an aspect of a direction of the crystal growth plane, 111 plane-centered polycrystalline silicon can be produced, and furthermore, polycrystalline silicon having crystals centering around a plane within an angle of 30 degree from the normal line of the 111 plane occupying more than 40% can be also produced.

The above process is automatically performed by a setting value input by the controller.

The apparatus for producing polycrystalline silicon ingot according to the present invention can produce a polycrystalline silicon ingot for a solar cell, which has very few defects and uniform crystal grains by solidifying the melted silicon in the crucible using the cooling plate.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. An apparatus for producing a polycrystalline silicon ingot comprising:
  a crucible for melting silicon;
  first conveying shafts disposed at edges of a pedestal mounted below the crucible for adjusting the height of the crucible;
  a plurality of first and second heaters that surround the crucible for heating the crucible, the second heaters being located beneath the crucible and being horizontally moveable to create an opening that exposes the crucible;
  a plurality of first and second insulating boards that surround the heaters, the second insulating boards being located beneath the second heaters and being horizontally moveable together with the second heaters located beneath the crucible;
  a conveying jig connected to and horizontally moving the second heaters and the second insulating boards; and
  a cooling plate located below the second insulating boards for cooling the crucible.

2. The apparatus for producing a polycrystalline silicon ingot according to claim 1, further comprising a third insulating board disposed beneath the apparatus for producing the polycrystalline silicon ingot.

3. The apparatus for producing a polycrystalline silicon ingot according to claim 2, further comprising second conveying shafts disposed at edges of the third insulating board for adjusting the height of the third insulating board.

4. The apparatus for producing a polycrystalline silicon ingot according to claim 2, wherein the cooling plate has fluid refrigerant flowing therein.

5. The apparatus for producing a polycrystalline silicon ingot according to claim 2, wherein the ingot producing apparatus is provided inside a chamber, which can create a vacuum.

6. The apparatus for producing a polycrystalline silicon ingot according to claim 5, wherein the chamber has a tube formed inside the wall surface thereof for allowing cooling water to flow therein.

7. The apparatus for producing a polycrystalline silicon ingot according to claim 1, wherein the cooling plate has fluid refrigerant flowing therein.

8. The apparatus for producing a polycrystalline silicon ingot according to claim 1, wherein the ingot producing apparatus is provided inside a chamber, which can create a vacuum.

9. The apparatus for producing a polycrystalline silicon ingot according to claim 8, wherein the chamber has a tube formed inside the wall surface thereof for allowing cooling water to flow therein.

* * * * *